US010989376B2

(12) United States Patent
Oyer (10) Patent No.: US 10,989,376 B2
(45) Date of Patent: Apr. 27, 2021

(54) ASSEMBLING OF STRIP OF MICRO LIGHT EMITTING DIODES ONTO BACKPLANE

(71) Applicant: Facebook Technologies, LLC, Menlo Park, CA (US)

(72) Inventor: Celine Claire Oyer, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 146 days.

(21) Appl. No.: 15/824,579

(22) Filed: Nov. 28, 2017

(65) Prior Publication Data

US 2019/0162374 A1 May 30, 2019

(51) Int. Cl.
*F21S 4/24* (2016.01)
*H01L 51/52* (2006.01)
(Continued)

(52) U.S. Cl.
CPC ............ *F21S 4/24* (2016.01); *H01L 25/0753* (2013.01); *H01L 25/167* (2013.01); *H01L 25/50* (2013.01);
(Continued)

(58) Field of Classification Search
CPC ........ F21S 4/24; H05B 45/00; H01L 25/0753; H01L 25/167; H01L 25/50; H01L 51/5203; G02B 27/0172; G02B 2027/0112
(Continued)

(56) References Cited

U.S. PATENT DOCUMENTS

2014/0138543 A1 5/2014 LaVeigne
2015/0054008 A1 2/2015 Rhee
(Continued)

FOREIGN PATENT DOCUMENTS

CN 107017319 A 8/2017
JP 2006/147679 6/2006
(Continued)

OTHER PUBLICATIONS

PCT International Search Report and Written Opinion, PCT Application No. PCT/US2018/057396, dated Feb. 22, 2019, 12 pages.
(Continued)

*Primary Examiner* — Michael G Lee
*Assistant Examiner* — David Tardif
(74) *Attorney, Agent, or Firm* — Fenwick & West LLP (57) ABSTRACT

Embodiments relate to fabricating a display device by assembling strips of μLED devices onto a backplane instead of individually picking and placing each μLED device onto the backplane. A strip of first μLED devices is coupled to a set of interconnections on the backplane. Then, the first fabrication substrate is removed from the strip of first μLED devices. A strip of second μLED devices producing another color (e.g., green) is attached to a second fabrication substrate. The strip of second μLED devices is coupled to another set of interconnections on the backplane. The process may be repeated for a strip of third μLED devices producing yet another color (e.g., blue). After attaching the second and third μLED devices, fabrication substrates on the second and third μLED devices are simultaneously removed by laser based lift-off (LLO) method.

8 Claims, 8 Drawing Sheets

(51) Int. Cl.
  *H01L 25/075* (2006.01)
  *H01L 25/00* (2006.01)
  *H01L 25/16* (2006.01)
  *H05B 45/00* (2020.01)
  *G02B 27/01* (2006.01)
(52) U.S. Cl.
  CPC ......... *H01L 51/5203* (2013.01); *H05B 45/00* (2020.01); *G02B 27/0172* (2013.01); *G02B 2027/0112* (2013.01)
(58) Field of Classification Search
  USPC .................................................. 362/249.02
  See application file for complete search history.

(56) References Cited

U.S. PATENT DOCUMENTS

| | | | |
|---|---|---|---|
| 2015/0060895 A1* | 3/2015 | Zeng | H01L 25/0753 257/88 |
| 2017/0250329 A1 | 8/2017 | Takeya et al. | |
| 2018/0047781 A1* | 2/2018 | Wang | H01L 33/32 |
| 2018/0112861 A1* | 4/2018 | Hagelaar | H05B 45/40 |
| 2018/0190712 A1* | 7/2018 | Xu | H01L 33/0012 |

FOREIGN PATENT DOCUMENTS

| | | |
|---|---|---|
| JP | 6131374 B1 | 5/2017 |
| KR | 10-2017/0047641 A | 5/2017 |

OTHER PUBLICATIONS

European Patent Office, European Search Report and Opinion, European Patent Application No. 18207794.1, dated Mar. 29, 2019, 31 pages.

PCT International Preliminary Report on Patentability, PCT Application No. PCT/US2018/057396, dated Jun. 11, 2020, nine pages.

* cited by examiner

ASSEMBLING OF STRIP OF MICRO LIGHT EMITTING DIODES ONTO BACKPLANE

BACKGROUND

This disclosure relates generally to assembling microLEDs (μLEDs), and in particular using strips of μLED devices to fabricate a display device.

A HMD, such as for a virtual reality (VR) system, typically includes an electronic display that emits light to the eyes of the viewer, and an optical block positioned between the display and the eyes. The optical block includes optical components that receive light emitted from the electronic display, and adjust an orientation of the light such that the electronic display appears at one or more particular focal distances from user. Light emitting devices, such as light emitting diodes (LEDs) are used in electronic display panels to emit light for image production.

The conventional method of producing μLED arrays involves picking an individual μLED device, placing it on a chip, and binding the μLED device to the chip. Such thin devices require development of a specific micro-assembly flow based on polymer adhesion or stamp which is costly and time-consuming.

SUMMARY

Embodiments relate to manufacturing a light emitting diode assembly by coupling strips of micro light emitting diodes (μLEDs) onto a backplane. Electrical contacts of a first strip of μLEDs attached with a first fabrication substrate are coupled to first interconnections on a backplane. The fabrication substrate is removed from the first strip of μLEDs after coupling the electrical contacts. A second strip of μLEDs is attached with a second fabrication substrate coupled to second interconnections on the backplane. The second fabrication substrate is removed from the second strip of μLEDs after coupling the second strip of μLEDs.

In one embodiment, a third strip of μLEDs attached with a third fabrication substrate is coupled to third interconnections on the backplane. The third fabrication substrate is removed from the third strip of μLEDs after coupling the third strip of μLEDs.

Embodiments also relate to assembly flow of light emitting diode assembly using monolithic assembly method. A strip of first μLED devices attached with a fabrication substrate is coupled with interconnections on a backplane. Electrodes of the strip attached to the interconnections share a first electrical contact that provide a first voltage to the strip of red μLED devices. The other electrodes not attached to the interconnections share a second electrical contact that provides a second voltage that is higher or lower than the first voltage.

The figures depict various embodiments of the present invention for purposes of illustration only.

DETAILED DESCRIPTION

Embodiments relate to a method to fabricating a display device by assembling strips of μLED devices onto a backplane instead of individually picking and placing each μLED device onto the backplane. A strip of first μLED devices producing one color (e.g., red) is attached to a first fabrication substrate. The strip of first μLED devices is coupled to a set of interconnections on the backplane. Then, the first fabrication substrate is removed from the strip of first μLED devices. A strip of second μLED devices producing the same or another color (e.g., red or green) is attached to a second fabrication substrate. The strip of second μLED devices is coupled to another set of interconnections on the backplane. The process may be repeated for a strip of third μLED devices producing the same or yet another color (e.g., red, green, or blue). After attaching the second and third μLED devices, fabrication substrates on the second and third μLED devices are simultaneously removed by laser based lift-off (LLO) method if the fabrication substrates on the second and third μLED devices are sapphire. The fabrication substrate described herein refers to the material on which a strip of μLED devices is fabricated. The fabrication substrate may be subject to one or more of deposition process, etching process and heating process to form the strip of μLED devices. The fabrication substrate may also provide structural support to the strip of μLED devices before the strip of μLED devices are transferred to a temporary carrier substrate or a backplane. This enables easier access when picking, placing, and boding of μLED devices using methods (e.g., vacuum pick and place) that are otherwise likely to damage or fracture μLED devices without additional structural support. When the substrate attached with the strip of μLED devices are removed after bonding to the backplane, only the μLED devices remain on the backplane.

The backplane herein refers to a substrate with interconnections for securing μLED devices and for providing current to the μLED devices. μLED devices are generally placed onto the backplane as their final target substrate.

Figure 1A:
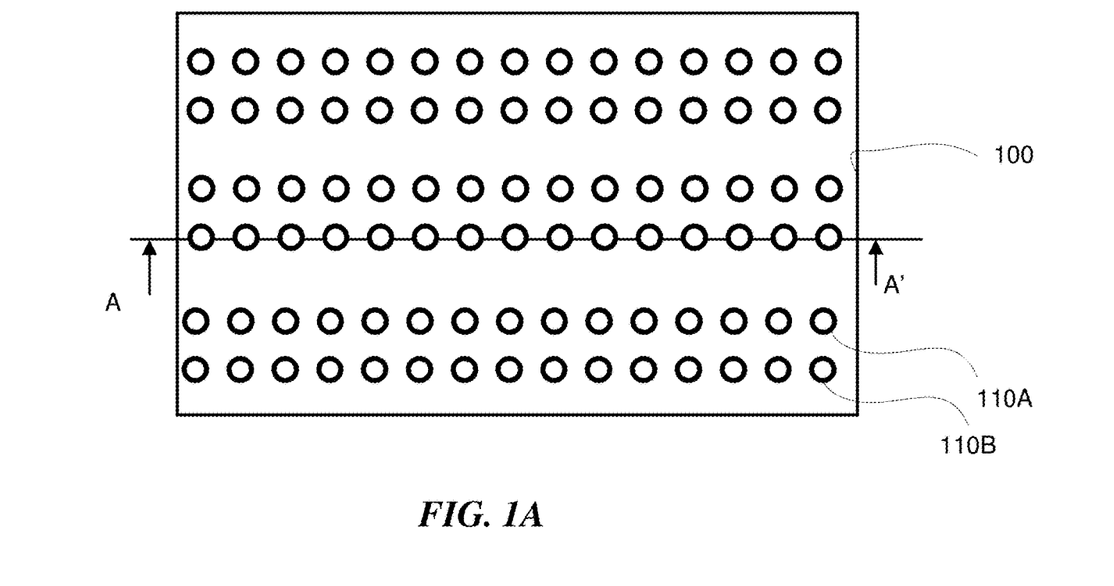
FIG. 1A is a plan view of a backplane and interconnections on the backplane, according to one embodiment.

FIG. 1A is a plan view of a backplane 100 and its interconnections 110, according to one embodiment. The interconnections 110 may be in the form of bumps and are connected to electrodes of the μLED devices to provide current to the μLED devices. For this purpose, the interconnections 110 are connected to conductive lines (not shown) that extend on or in the backplane 100. The interconnections 110 may include interconnections 110A that are connected to p-electrodes and interconnections 110B that are connected to n-electrodes. In other embodiments, only p-electrodes are provided as interconnections 110 on the backplane 100 while a conductive line may be connected to a side of the separate line to function as a common negative voltage source (i.e., ground). The interconnections 110 may be made of conductive materials such as copper, copper alloys and silver.

As illustrated in FIG. 1A, the interconnections 110 are formed along straight lines that extend parallel to each other. However, in other embodiments, the interconnections may be formed along curved lines or some random lines.

The backplane 100 is a substrate sufficiently rigid to provide support for the µLED devices. The backplane 100 may be formed of silicon or other materials with conductive lines on or in the backplane 100 to provide current to turn on the µLED devices. The backplane 100 may also include circuit components (not shown) such as transistors and capacitance to operate the µLED devices.

Figure 1B:
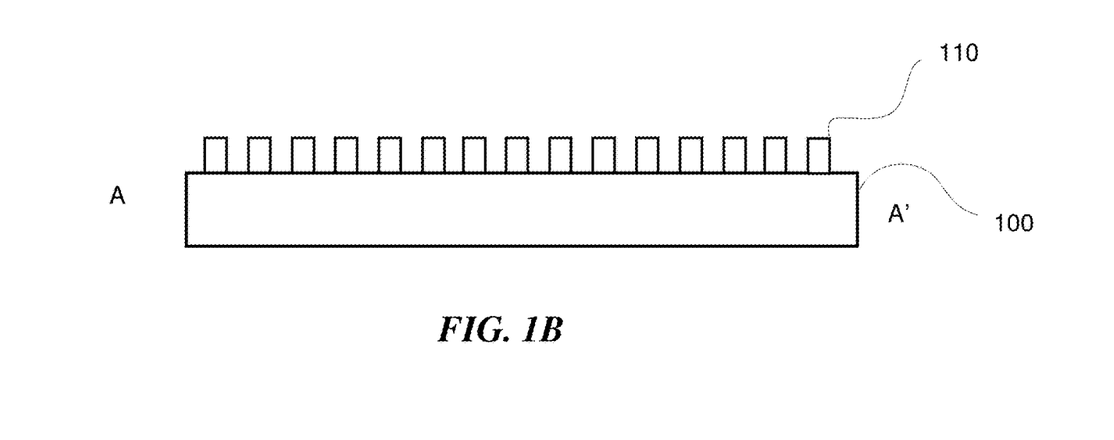
FIG. 1B is a cross-sectional diagram illustrating the backplane the interconnections taken along line A-A' of FIG. 1A, according to one embodiment.

FIG. 1B is a cross-sectional diagram illustrating the backplane 100, the interconnections 110 taken along line A-A' of FIG. 1A, according to one embodiment. The rows of interconnections 110A, 110B extend across the backplane 110 and protrude from the top surface of the backplane 100.

Figure 2:
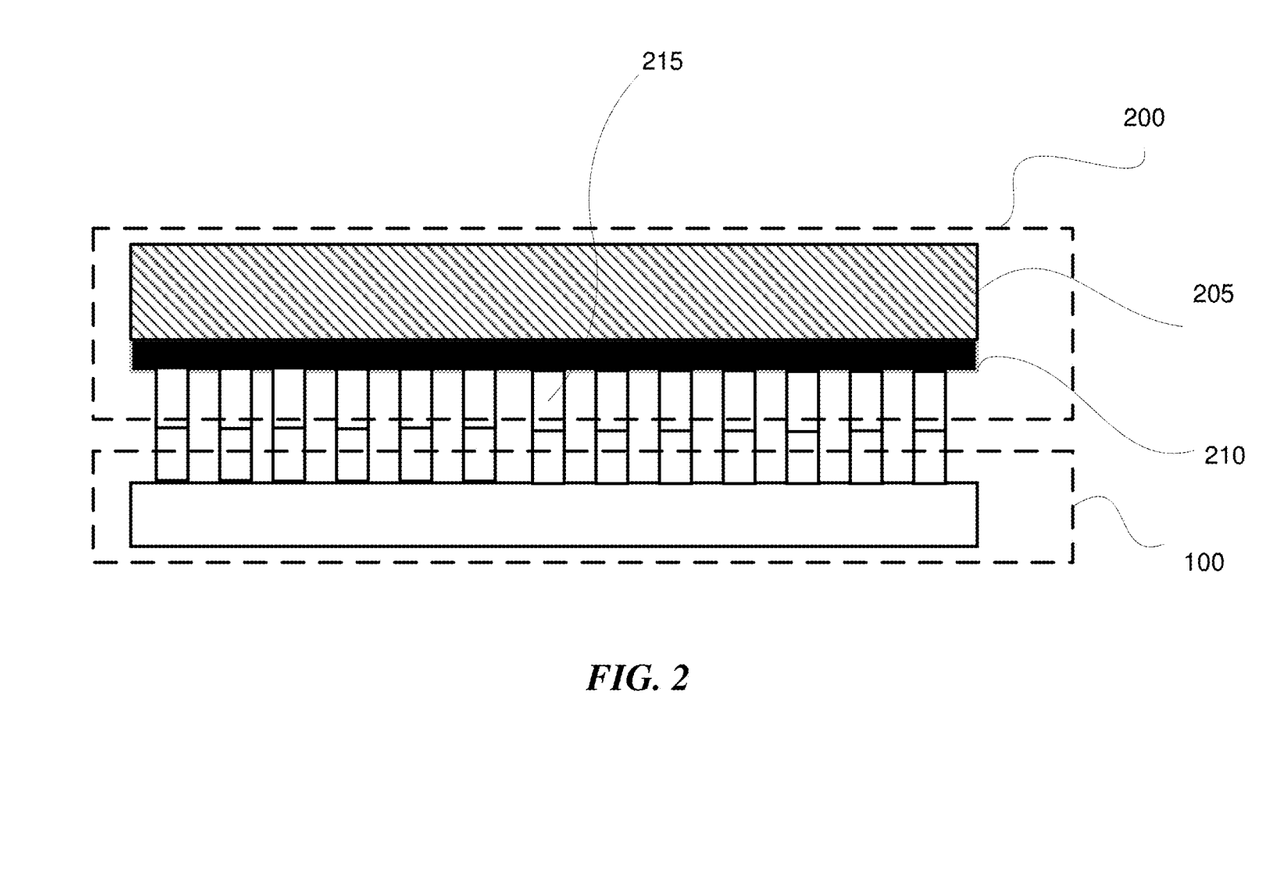
FIG. 2 illustrates the backplane attached with a strip of red μLED devices through interconnections, according to one embodiment.

FIG. 2 illustrates the backplane 100 attached with a strip of red µLED devices 200, according to one embodiment. The red µLED devices 200 are fabricated on a fabrication substrate 205, which may be GaAs. A body 210 of red µLED devices 200 may be fabricated, for example, by growing various layers of material on the fabrication substrate 205 using chemical vapor deposition (CVD). The red µLED devices 200 also include electrodes 215. In one embodiment, each µLED device 200 includes a p-electrode and a n-electrode, while in other embodiments, each µLED device may have either of an individual p-electrode but sharing n-electrode through the body of the µLED device or vice versa.

The electrodes 215 of the red µLED devices 200 are connected to the interconnections 110 of the backplane 100 through, for example, thermocompressive (TC) bonding.

Figure 3:
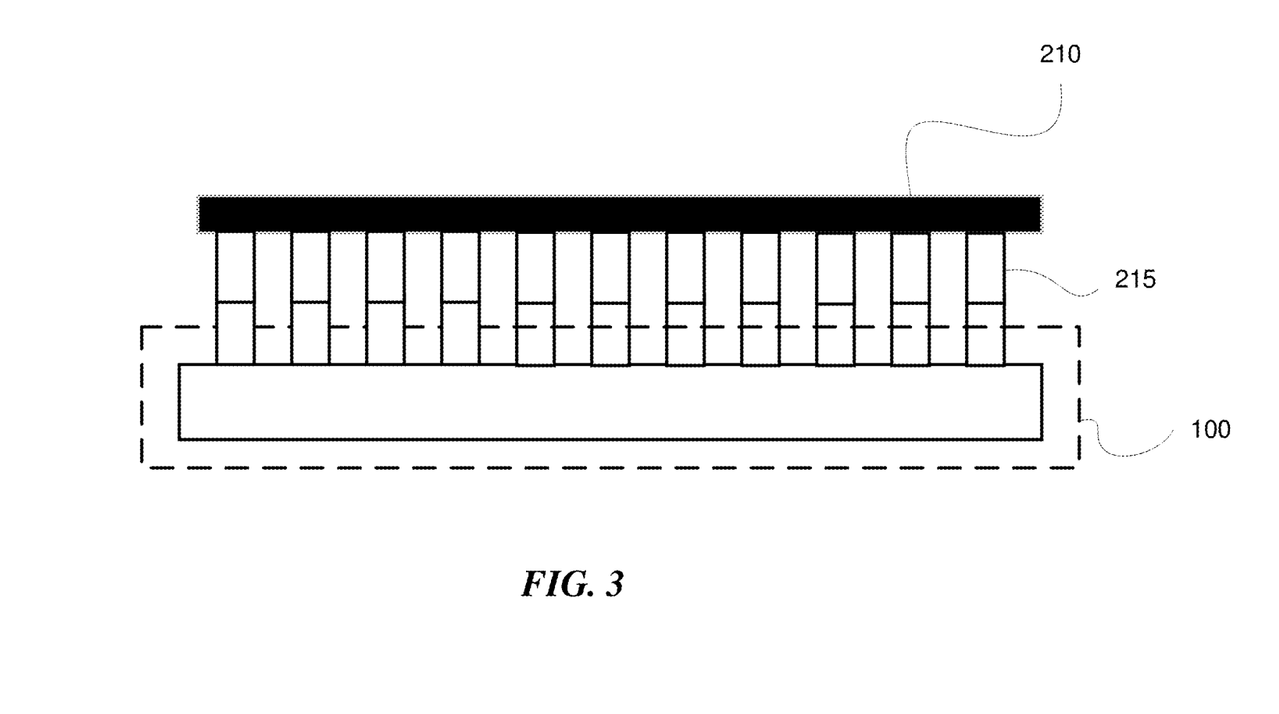
FIG. 3 illustrates the backplane attached with the strip of red μLED devices in FIG. 2 and its fabrication substrate removed, according to one embodiment.

FIG. 3 illustrates the backplane 100 attached with the strip of red µLED devices 200 in FIG. 2 and the fabrication substrate 205 removed, according to one embodiment. The fabrication substrate 205 attached with the body 210 of red µLED devices is unnecessary once the strip of red µLED 200 is mounted onto the backplane 100 because the backplane 100 provides support for the body 210 of red µLED devices.

In one or more embodiments, the backplane 100 is removed from the strip of red µLED devices 200 by etching. Hence, portions of the backplane 100 and interconnections 110 not attached with the strip of red µLED devices 200 are covered with a layer of resist material to prevent an etching medium from negatively impacting properties of these components. After applying a layer of resist material, the backplane 100 attached with the strip of red µLED devices 200 is treated with the etching medium. The resist material is selected based on factors such as the etching medium used, the temperature of the etching medium, and duration of etching. When the backplane 100 is immersed in a chemical bath of etching medium, the fabrication substrate 200 is selectively removed from the strip of red µLED devices 200, exposing the body 210 of µLED devices.

Figure 4:
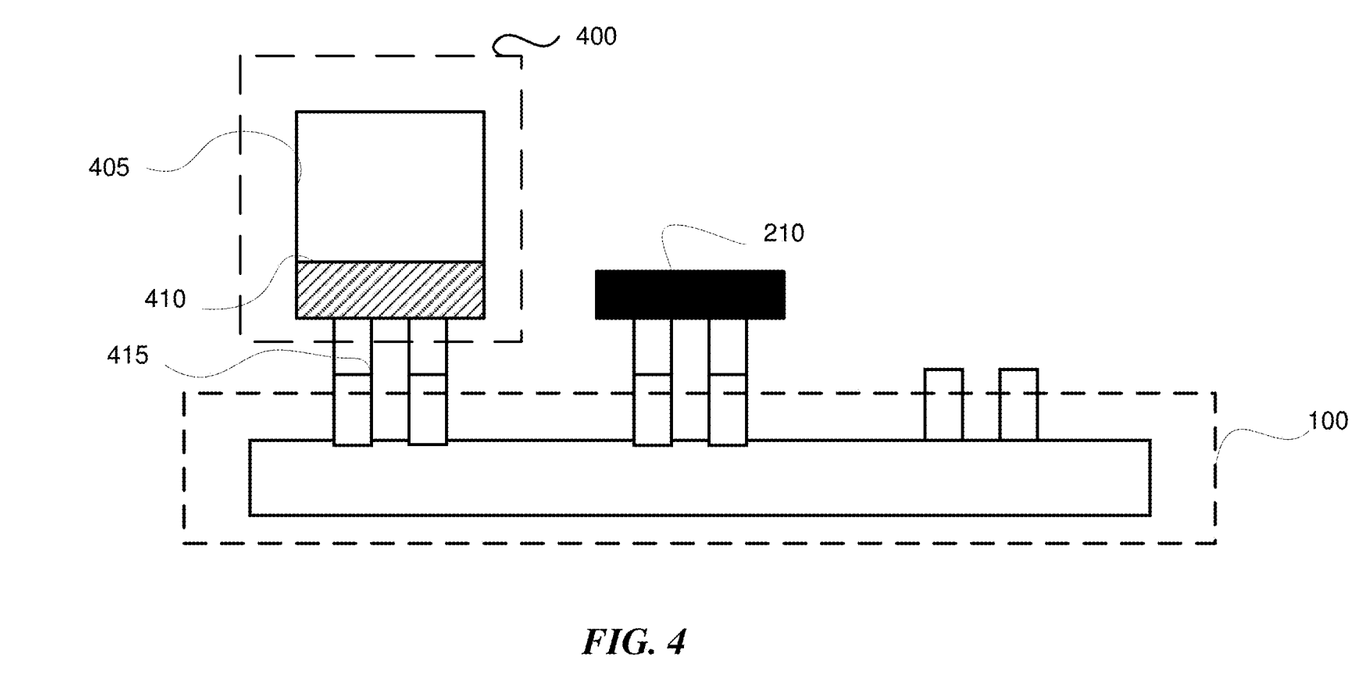
FIG. 4 illustrates the backplane attached with an additional strip of green μLED devices, according to one embodiment.

FIG. 4 illustrates the backplane 100 attached with an additional strip of green µLED devices 400 adjacent and parallel to the strip of red µLED devices 400, according to one embodiment. The green µLED devices 400 are fabricated on a fabrication substrate 405, which may be a transparent substrate such as sapphire. The body 410 of green µLED devices 400 may be fabricated, for example, by growing various layers of material on the fabrication substrate 405 using, for example, chemical vapor deposition (CVD). The body 410 may comprise InGaN, with the ratio of Indium adjusted to create a bandgap that is associated with green light. Because there is a high lattice mismatch between Sapphire and InGaN due to their crystal structure, there may be a GaN buffer (not shown in FIG. 4) placed between the fabrication substrate 405 and the body 410 to decrease the lattice mismatch.

The green µLED devices 400 also include electrodes 415. In one embodiment, each µLED device 400 includes a p-electrode and a n-electrode, while in other embodiments, each µLED device may have either of an individual p-electrode but sharing n-electrode through the body of the µLED device or vice versa. The electrodes 415 of the green µLED devices 400 are connected to the interconnections 110 of the backplane 100 through, for example, temperature and compression (TC) bonding.

Figure 5:
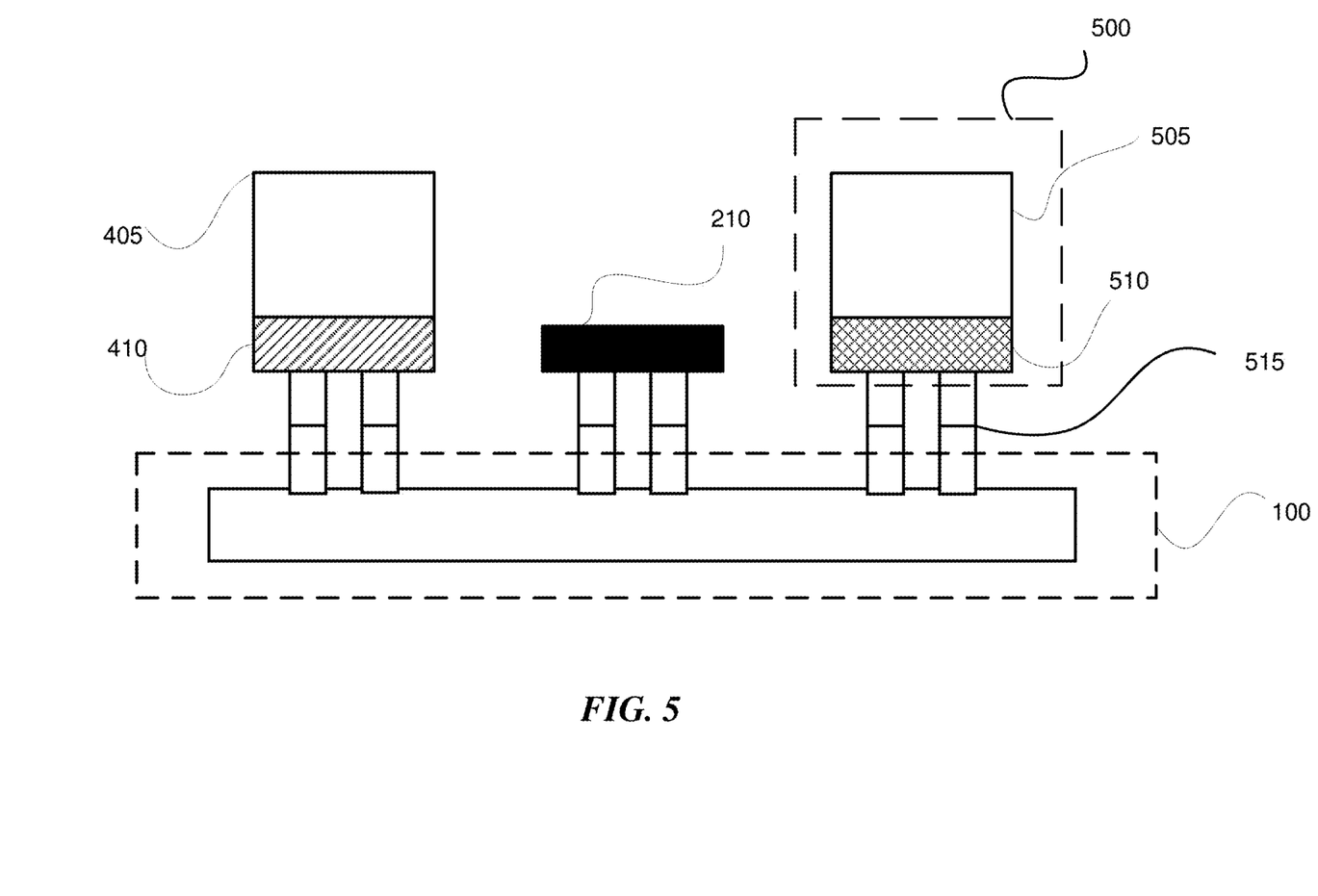
FIG. 5 illustrates the backplane attached with a strip of blue μLED devices, according to one embodiment.

The strip of green µLED is attached with a portion of backplane 100 adjacent and parallel to the strip of red µLED. The electrodes 415 of the green µLED devices 400 are attached with the body 410, which is attached with the sapphire 405. The electrodes 415 of the green µLED devices 400 are connected to the interconnections 110 of the backplane 100 through, for example, temperature and compression (TC) bonding. FIG. 5 illustrates the backplane attached with a strip of blue µLED devices 500 adjacent and parallel to the strips of µLED devices 200, 400, according to one embodiment. The backplane 100 is attached with the strip of red µLED devices 200 with the fabrication substrate 205 etched away and the body 210 exposed. The backplane 100 is also attached to the strip of green µLED devices 400, adjacent and parallel to the strip of red µLED devices 200. The strip of blue µLED 500 is attached with a portion of backplane 100 adjacent to the strip of red µLED devices 200 and the strip of green µLED devices 400. The strip of blue µLED devices 500 may be manufactured in the same way the strip of green µLED devices 400 is manufactured. The body 510 may be fabricated, for example, by growing various layers of material on the fabrication substrate 505 using chemical vapor deposition (CVD). The body 510 may comprise InGaN, with the ratio of Indium adjusted to create a bandgap that is associated with blue light. Because there is a high lattice mismatch between Sapphire and InGaN due to their crystal structure, there may be a GaN buffer (not shown in FIG. 5) placed between the fabrication substrate 505 and the body 510 to decrease the lattice mismatch.

The electrodes 515 of the blue µLED devices 500 are attached to the body 510. The body 410 is attached with the fabrication substrate 505, which can be sapphire. The electrodes 515 of the blue µLED devices 500 are connected to the interconnections 110 of the backplane 100 through, for example, thermocompression (TC) bonding.

Figure 6:
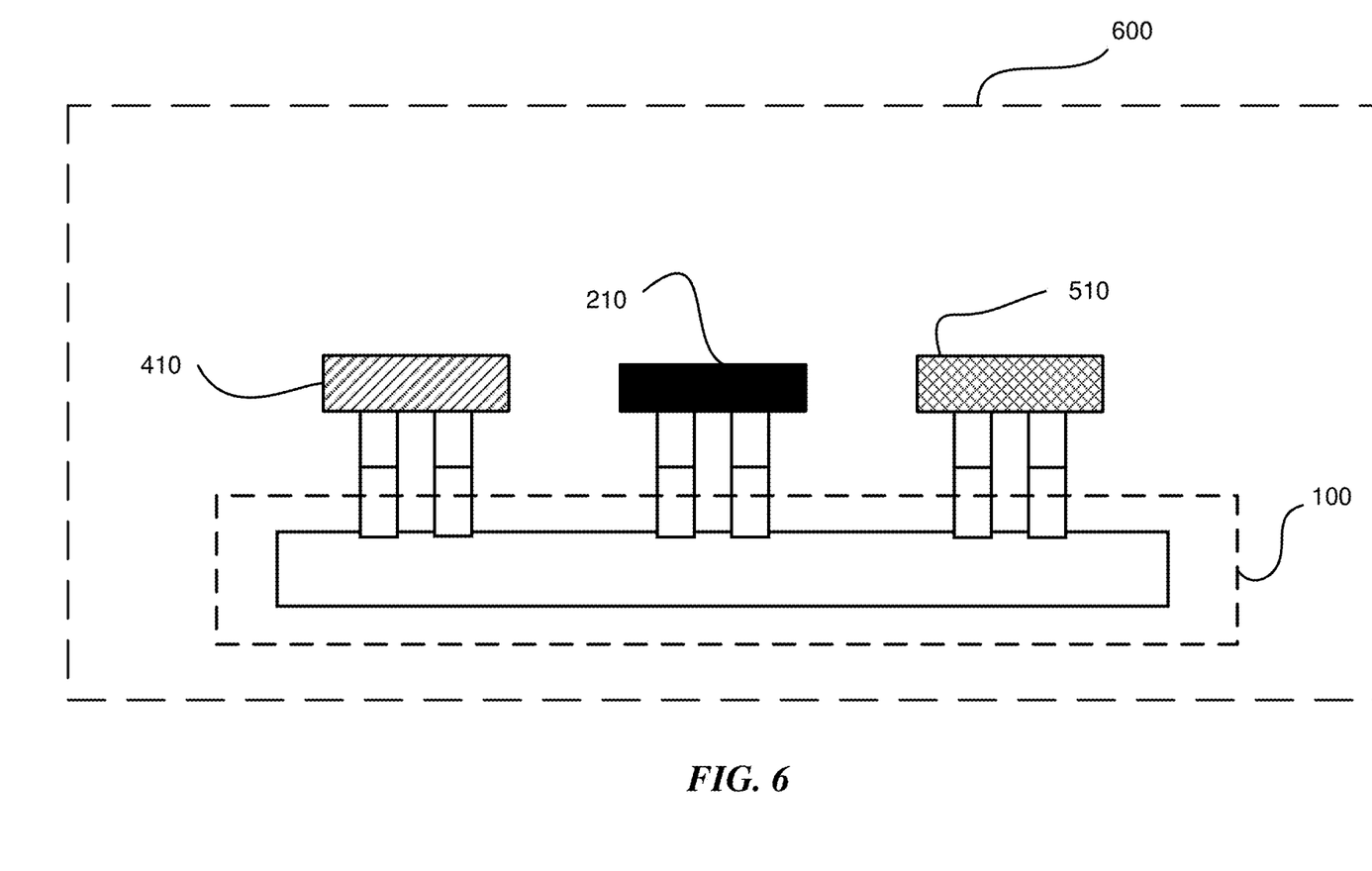
FIG. 6 illustrates the backplane attached with strips of red, blue, and green μLED devices without fabrication substrates, according to one embodiment.

FIG. 6 illustrates the backplane 100 attached with strips of red, blue, and green µLED devices without fabrication substrates, according to one embodiment. The strip of green µLED devices 400 attached with the fabrication substrate 405 is adjacent and parallel to the strip of blue µLED devices 500 attached with the fabrication substrate 505. The strips of blue and green µLED devices 400 and 500 are adjacent and parallel to the strip of red µLED devices 200 with the fabrication substrate 205 etched away.

The fabrication substrate 405 attached with the strip of green µLED devices 400 and the fabrication substrate 505 attached with the strip of blue µLED devices 500 are removed using Laser Lift Off (LLO) method. A high-power ultraviolet pulsed laser is simultaneously irradiate the strips of green µLED devices 400 and the strips of blue µLED devices 500 from the surface closest to the fabrication substrates 405 and 505. The fabrication substrates 405 and 505 may be sapphire which is transparent and do not absorb the light from the laser. The light from the laser passes through the layer of fabrication substrates 405 and 505 but is absorbed by the GaN buffer. Due to the high power, there is thermal decomposition of the GaN buffer, and the interface between the sapphire and the GaN buffer is ablated. When the fabrication substrates 405 and 505 are detached from the GaN buffer, the fabrication substrates 405 and 505 are lifted from the bodies 410 and 510, simultaneously. After the fabrication substrates 405 and 505 are removed, an array of μLED devices 600 remains with the backplane 100 coupled to three strips of μLED devices of different colors.

Figure 7:
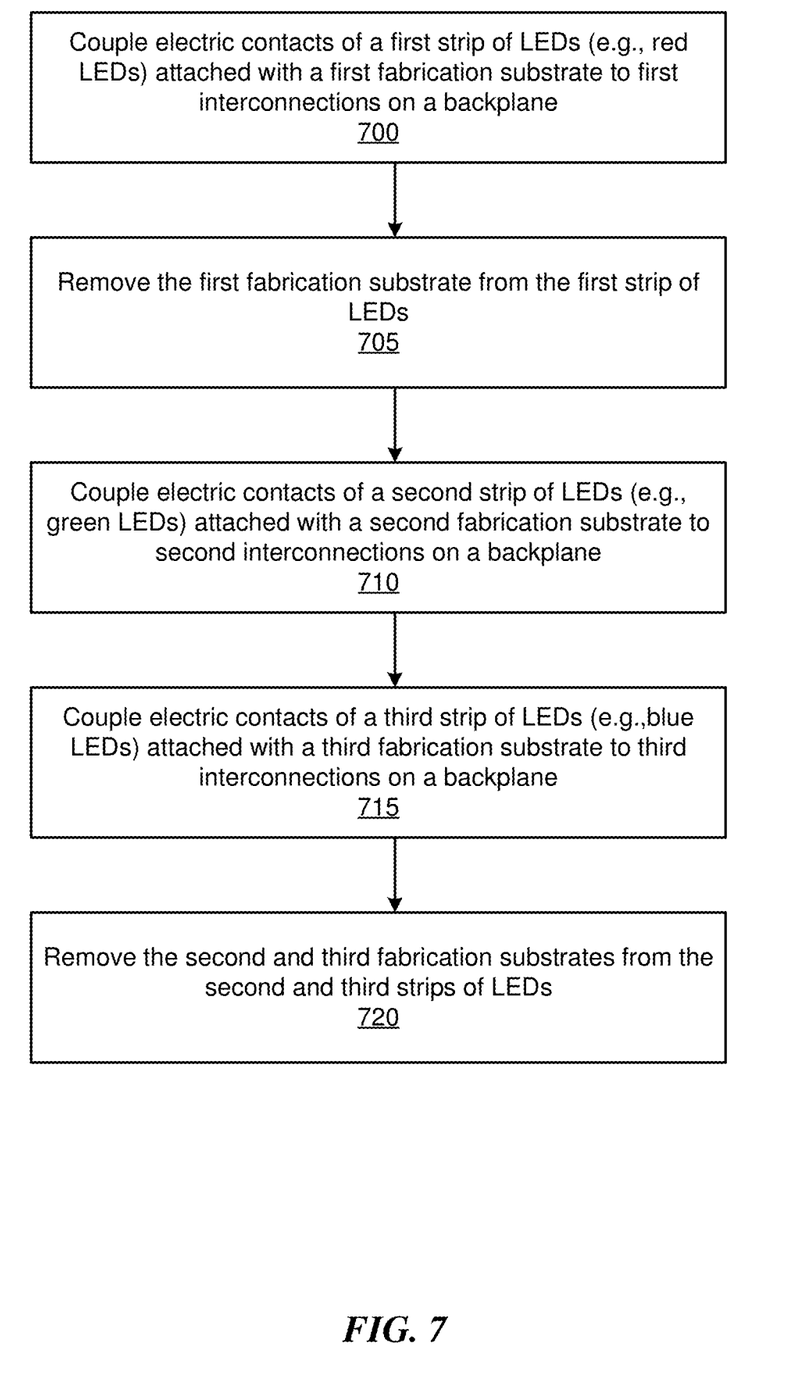
FIG. 7 is a flowchart illustrating the process of manufacturing a μLED devices array, according to one embodiment.

FIG. 7 is a flowchart illustrating the process of manufacturing a μLED devices array, according to one embodiment. Electric contacts of a first strip of LEDs (e.g., red LEDs) attached with a first fabrication substrate (e.g., GaAs) is coupled 700 to first interconnections on a backplane.

The first fabrication substrate is removed 705 from the first strip of LEDs. Electric contacts of a second strip of LEDs (e.g., green LEDs) are coupled 710 with a second fabrication substrate (e.g., sapphire) to second interconnections on a backplane.

Electric contacts of a third strip of LEDs (blue LEDs) are coupled 715 with a third fabrication substrate (e.g., sapphire) to third interconnections on a backplane. The second and third fabrication substrates are removed 720 from the second and third strips of LEDs. The second and third fabrication substrates can be removed simultaneously or sequentially.

The process described above with reference to FIG. 7 is merely illustrative. In other embodiments, the first fabrication substrate can also be removed together with the second and third fabrication substrates instead of being removed first. In other embodiments, the second fabrication substrate may be removed before the third strip of μLED devices is coupled to the backplane. In other embodiments, the process of coupling a strip of μLED devices attached with a fabrication substrate and removing the fabrication substrate may be repeated, and there may more than three strips of μLED devices coupled to the backplane.

Figure 8:
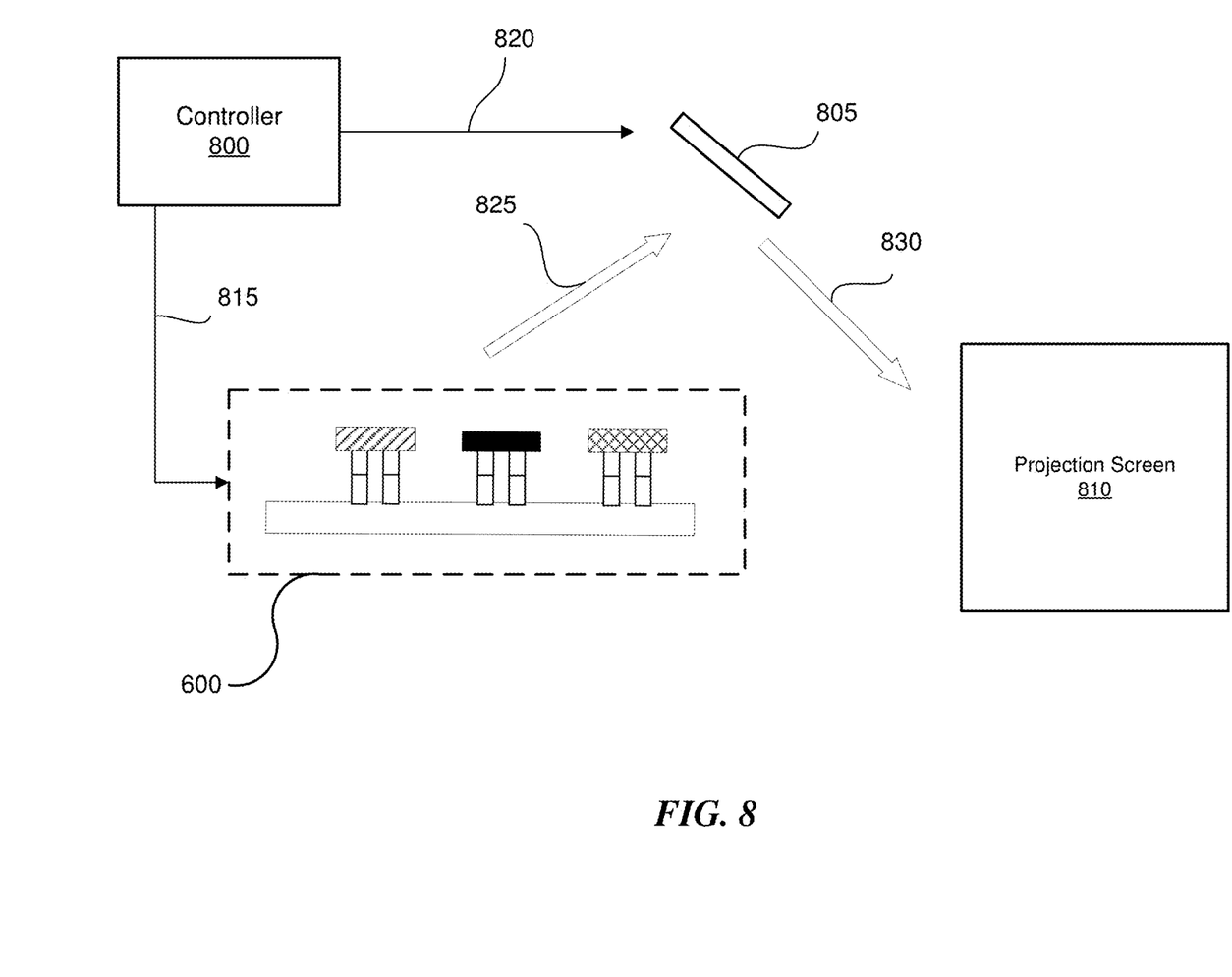
FIG. 8 is a schematic diagram illustrating a display system using an array of μLED devices to project an image onto a projection screen, according to one embodiment.

FIG. 8 is a schematic diagram illustrating a display system using an array of μLED devices 600 to project an image onto a projection screen 810, according to one embodiment. The system may include, among other components, the array of μLED devices 600, a controller 800, a microelectromechanical system (MEMS) mirror 805, and a projection screen 801.

The array of μLED devices 600 may have strips of red, green, and blue μLED devices, as described above with reference to FIG. 6. In some embodiments, the array of μLED devices 600 may have additional strips of μLED devices that emit light of a different color (e.g., yellow). Each strip of μLED devices may have, for example, 1028 μLED devices such that there are 1028×3 μLED devices in total in the array of μLED devices 600.

The controller 800 generates signals 815 to control the array of μLED devices 600. The controller 800 may receive an input from an external host computer system, a mobile device or computing system, or any other hardware platform capable of providing image content. The input data controls in part the signals 815 that determine the voltage supplied to conductive lines that extend on or in the backplane 100 of the array of μLED devices 600. By varying the amount of voltage applied to different portions of the array of μLED devices 600, a combination of displays can be created by the array of μLED devices 600. The controller also generates signals 820 to control the MEMS mirror 805 so that the light 825 from the array of μLED devices 600 is reflected by the mirror 805. The MEMS mirror 805 is adjusted so that the reflected light 830 is projected onto the projection screen 810. The controller 800 changes the activation and brightness of the array of μLED devices 600 while controlling the MEMS mirror 805 so that images are formed on the projection screen 810 in a raster fashion.

In some embodiments, the array of μLED devices 600, mirror 805, and projection screen 810 are in a near-eye device (NED). Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method of manufacturing a light emitting diode assembly comprising:
coupling first p-electrodes of a first strip of light emitting diodes (LEDs) attached with a first fabrication substrate to a first row of interconnections extended along a first line on a backplane with the first p-electrodes extending in a direction away from a body of the first strip of LEDs toward the backplane, the first strip of LEDs configured to emit light of a first color and share a first n-electrode;
removing the fabrication substrate from the first strip of LEDs responsive to coupling the first p-electrodes;
coupling second p-electrodes of a second strip of LEDs attached with a second fabrication substrate to a second row of interconnections extended along a second line spaced apart from the first row on the backplane with the second p-electrodes extending in the direction away from a body of the second strip of LEDs toward the backplane, the second strip of LEDs configured to emit light of a second color different from the first color and share a second n-electrode; and removing the second fabrication substrate from the second strip of LEDs responsive to coupling the second p-electrodes.

2. The method of claim 1, further comprising:
coupling third p-electrodes of a third strip of LEDs attached with a third fabrication substrate to a third row of interconnections extended along a third line spaced apart from the first row and the second row on the backplane with the third p-electrodes extending in the direction away from a body of the third strip of LEDs toward the backplane; and
removing the third fabrication substrate from the third strip of LEDs responsive to coupling the third p-electrodes.

3. The method of claim 2, wherein the second fabrication substrate and the third fabrication substrate are made of sapphire.

4. The method of claim 3, wherein the second fabrication substrate and the third fabrication substrate are simultaneously removed using Laser Lift Off (LLO).

5. The method of claim 1, wherein the first p-electrodes of the first strip of LEDs are attached to the first row of interconnections on the backplane and the second p-electrodes of the second strip of LEDs are attached to the second row of interconnections on the backplane through temperature and compress (TC) bonding.

6. The method of claim 1, wherein the first fabrication substrate is made of GaAs.

7. The method of claim 6, wherein removing the first fabrication substrate comprises:
etching the first fabrication substrate by chemical wet etching.

8. The method of claim 1, wherein each of the first and second strips of LEDs comprises micro LEDs.

* * * * *